United States Patent
Chang et al.

(10) Patent No.: US 8,518,534 B2
(45) Date of Patent: Aug. 27, 2013

(54) COATING, ARTICLE COATED WITH COATING, AND METHOD FOR MANUFACTURING ARTICLE

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Zhi-Jie Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 205 days.

(21) Appl. No.: 13/008,991

(22) Filed: Jan. 19, 2011

(65) Prior Publication Data

US 2012/0052280 A1   Mar. 1, 2012

(30) Foreign Application Priority Data

Aug. 31, 2010   (CN) .......................... 2010 1 0268020

(51) Int. Cl.
*B32B 9/00* (2006.01)

(52) U.S. Cl.
USPC ........... 428/336; 428/469; 428/472; 428/697; 428/698; 428/699

(58) Field of Classification Search
USPC .................. 428/336, 469, 472, 697, 698, 699
See application file for complete search history.

(56) References Cited

U.S. PATENT DOCUMENTS

| | | | | |
|---|---|---|---|---|
| 3,900,592 A | * | 8/1975 | Kennedy et al. | 428/212 |
| 5,304,417 A | * | 4/1994 | Zurecki et al. | 428/698 |
| 5,580,653 A | * | 12/1996 | Tanaka et al. | 428/336 |
| 6,555,241 B1 | * | 4/2003 | Erbsloh et al. | 428/472 |
| 7,147,939 B2 | * | 12/2006 | Henderer et al. | 428/698 |
| 7,368,182 B2 | * | 5/2008 | Kubota | 428/697 |

* cited by examiner

*Primary Examiner* — Archene Turner
(74) *Attorney, Agent, or Firm* — Altis Law Group, Inc.

(57) ABSTRACT

A coating includes a titanium aluminum silicon carbon-nitride layer including a first surface and an opposite second surface. The atomic carbon content and/or the atomic nitrogen content in the titanium aluminum silicon carbon-nitride layer gradually increases from the first surface to the second surface.

6 Claims, 4 Drawing Sheets

COATING, ARTICLE COATED WITH COATING, AND METHOD FOR MANUFACTURING ARTICLE

CROSS-REFERENCE TO RELATED APPLICATIONS

The present application is related to co-pending U.S. patent application Ser. Nos. 13/008,984, 13/008,987, entitled "COATING, ARTICLE COATED WITH COATING, AND METHOD FOR MANUFACTURING ARTICLE", by Zhang et al. These applications have the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and method for manufacturing the articles.

2. Description of Related Art

Physical vapor deposition (PVD) has conventionally been used to form a coating on metal bases of cutting tools or molds. Materials used as this coating material are required to have excellent hardness and toughness. Presently, Titanium nitride (TiN) and Titanium-aluminum nitride (TiAlN) are mainly used as a material satisfying these requirements. However, these coating materials have a low hardness and a low temperature oxidation resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
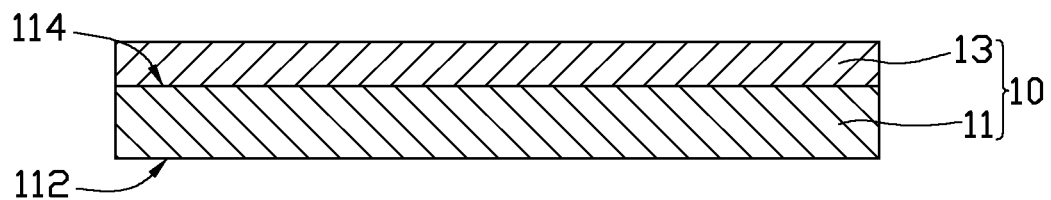
FIG. 1 is a cross-sectional view of an exemplary embodiment of coating.

Referring to FIG. 1, a coating 10 includes a titanium aluminum silicon carbon-nitride (TiAlSiCN) layer 11. The TiAlSiCN layer 11 may be deposited by magnetron sputtering. The TiAlSiCN layer 11 has a thickness ranging from about 0.7 micrometers to about 2.5 micrometers. The TiAlSiCN layer 11 includes a first surface 112 and an opposite second surface 114. The atomic carbon content and/or the atomic nitrogen content in the TiAlSiCN layer 11 gradually increases from the first surface 112 to the second surface 114. It is to be understood that the coating 10 may also include a color layer 13 covering on the second surface 114 of the TiAlSiCN layer 11, to decorate the appearance of the coating 10.

Figure 2:
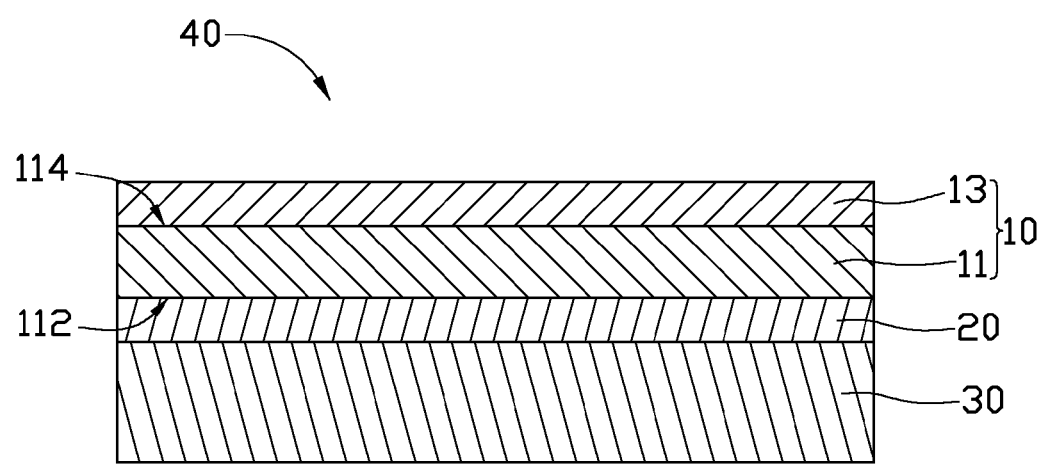
FIG. 2 is a cross-sectional view of an article coated with the coating in FIG. 1.

Referring to FIG. 2, an exemplary article 40 includes a substrate 30, a bonding layer 20 deposited on the substrate 30 and the coating 10 deposited on bonding layer 20. The first surface 112 of the coating 10 covers on the bonding layer 20. The substrate 30 is made of a metal, such as high speed steel, hard alloy, or stainless steel. The article 40 may be cutting tools, molds, or housings of electronic devices. The bonding layer 20 is a titanium aluminum silicon (TiAlSi) layer. The bonding layer 20 has a thickness ranging from about 200 nanometers to about 300 micrometers. The bonding layer 20 can be deposited by magnetron sputtering. The chemical stability of the bonding layer 20 is between the chemical stability of the substrate 30 and the chemical stability of the coating 10, and the coefficient of thermal expansion of the bonding layer 20 is between the coefficient of thermal expansion of the substrate 30 and the coefficient of thermal expansion of the coating 10. Thus, the bonding layer 20 is used to improve binding force between the substrate 30 and the coating 10 so the coating 10 can be firmly deposited on the substrate 30.

Figure 3:
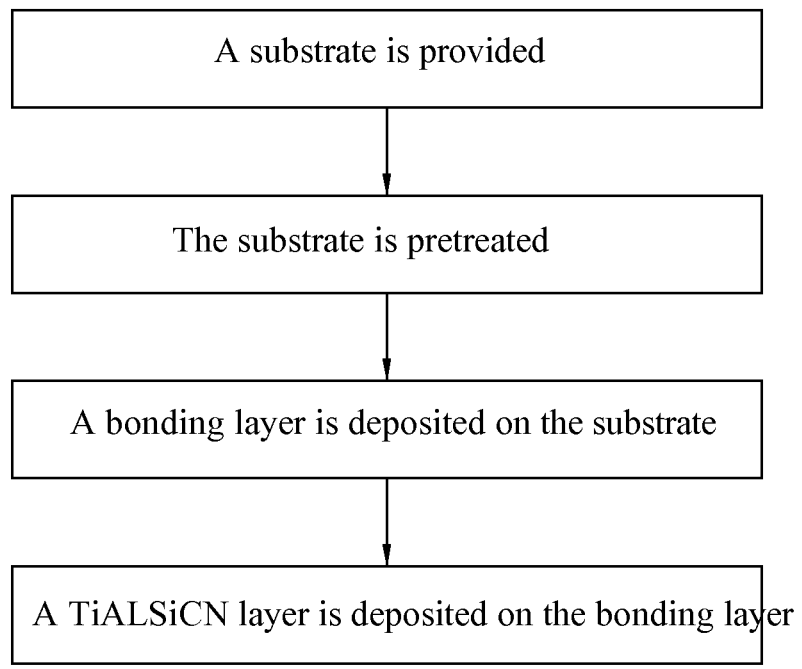
FIG. 3 is a block diagram of a method for manufacturing an article coated with the coating in FIG. 1.
Figure 4:
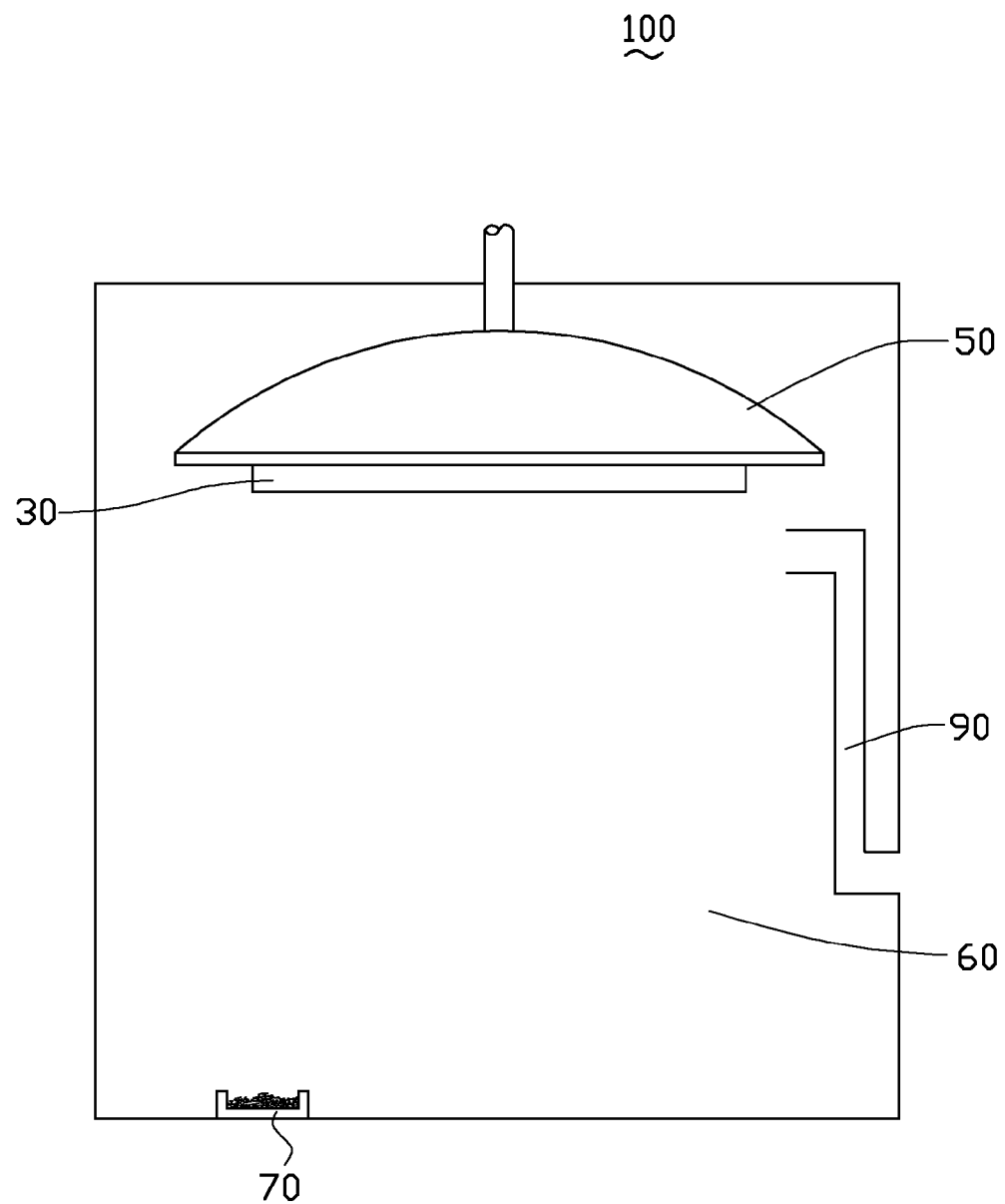
FIG. 4 is a schematic view of a magnetron sputtering coating machine for manufacturing the article in FIG. 2.

Referring to FIG. 3, a method for manufacturing the article 40 may include at least the following steps:

A substrate 30 is provided. The substrate 30 may be made of high speed steel, hard alloy, or stainless steel.

The substrate 30 is pretreated by cleaning the substrate 30 using deionized water and alcohol successively. The substrate 30 is then washed with a solution (e.g., Alcohol or Acetone) in an ultrasonic cleaner, to remove impurities such as grease, or dirt. The substrate 30 is dried. The substrate 30 is cleaned by argon plasma cleaning. The substrate 30 is retained on a rotating bracket 50 in a vacuum chamber 60 of a magnetron sputtering coating machine 100. The vacuum level of the vacuum chamber 60 is adjusted to about 8.0×10−3 Pa, pure argon is fed into the vacuum chamber 60 at a flux of about 100 Standard Cubic Centimeters per Minute (sccm) to about 300 sccm from a gas inlet 90, and a bias voltage is applied to the substrate 30 in a range of about −300 to −500 volts for about 10-15 minutes. So the substrate 30 is washed by argon plasma, to further remove the grease or dirt. Thus, the binding force between the substrate 30 and the coating 10 is enhanced.

A bonding layer 20 is deposited on the substrate 30. The temperature in the vacuum chamber 60 is adjusted to about 250~400° C. (Celsius degree); the argon is fed into the vacuum chamber 60 at a flux from about 100 sccm to about 200 sccm from the gas inlet 90, in this exemplary embodiment, at about 150 sccm; a titanium aluminum silicon alloy target 70 in the vacuum chamber 60 is evaporated; a bias voltage applied to the substrate 30 may be in a range of about −300 to about −500 volts, for about 5 to 10 min, to deposit the bonding layer 20 on the substrate 30. The titanium aluminum silicon alloy target 70 contains atomic silicon in a range from about 1 to about 10 wt %, and the wt % content of the atomic titanium in the titanium aluminum silicon alloy target 70 is equal to the wt % content of the atomic aluminum in the titanium aluminum silicon alloy target 70.

A TiAlSiCN layer 11 is deposited on the bonding layer 20. In a first exemplary embodiment, the temperature in the vacuum chamber 60 is kept at about 250~400° C.; argon is fed into the vacuum chamber 60 at a flux from about 100 sccm to about 200 sccm, methane is fed into the vacuum chamber 60 at a flux from about 5 sccm to about 15 sccm and nitrogen is fed into the vacuum chamber 60 at a flux from about 10 sccm to about 20 sccm from the gas inlet 90; the titanium aluminum alloy target 70 is evaporated; a bias voltage applied to the substrate 30 may be in a range of about −50 to about −300 volts, for about 60 to about 150 min, to deposit the TiAlSiCN layer 11 on the bonding layer 20. During depositing the TiAlSiCN layer 11 on the bonding layer 20, the flux of the nitrogen and the flux of the methane are both increased about 15 sccm to about 20 sccm every 15 minutes. Thus, the atomic carbon content and the atomic nitrogen content in the TiAl-SiCN layer 11 gradually increases from the first surface 112 to the second surface 114. In other words, the atomic carbon content and the atomic nitrogen content in the TiAlSiCN layer 11 gradually increases from near the bonding layer 20 to away from the bonding layer 20.

A second exemplary embodiment for depositing the TiAl-SiCN layer 11 on the bonding layer 20 is as follows: the temperature in the vacuum chamber 60 is kept at about 250~400° C.; argon is fed into the vacuum chamber 60 at a flux from about 100 sccm to about 200 sccm, methane is fed into the vacuum chamber 60 at a flux from about 5 sccm to about 15 sccm and nitrogen is fed into the vacuum chamber 60 at a flux from about 50 sccm to about 220 sccm from the gas inlet 90; the titanium aluminum alloy target 70 is evaporated; a bias voltage applied to the substrate 30 may be in a range of about −50 to about −300 volts, for about 60 to about 150 min, to deposit the TiAlSiCN layer 11 on the bonding layer 20. During depositing the TiAlSiCN layer 11 on the bonding layer 20, the flux of the methane is increased about 15 sccm to about 20 sccm every 15 minutes. Thus, in the second exemplary embodiment, the atomic carbon content in the TiAlSiCN layer 11 gradually increases from the first surface 112 to the second surface 114. In other words, the atomic carbon content in the TiAlSiCN layer 11 gradually increases from near the bonding layer 20 to away from the bonding layer 20.

A third exemplary embodiment for depositing the TiAl-SiCN layer 11 on the bonding layer 20 is as follows: the temperature in the vacuum chamber 60 is kept at about 250~400° C.; argon is fed into the vacuum chamber 60 at a flux from about 100 sccm to about 200 sccm, methane is fed into the vacuum chamber 60 at a flux from about 50 sccm to 220 sccm and nitrogen is fed into the vacuum chamber 60 at a flux from about 5 sccm to about 15 sccm from the gas inlet 90; the titanium aluminum alloy target 70 is evaporated; a bias voltage applied to the substrate 30 may be in a range of about −50 to about −300 volts, for about 60 to 150 min, to deposit the TiAlSiCN layer 11 on the bonding layer 20. During depositing the TiAlSiCN layer 11 on the bonding layer 20, the flux of the nitrogen is increased about 15 sccm to about 20 sccm every 15 minutes. Thus, in the third exemplary embodiment, the atomic nitrogen content in the TiAlSiCN layer 11 gradually increases from the first surface 112 to the second surface 114. In other words, the atomic nitrogen content in the TiAlSiCN layer 11 gradually increases from near the bonding layer 20 to away from the bonding layer 20.

It is to be understood that the color layer 13 may be deposited on the TiAlSiCN layer 11 to improve the appearance of the article 40.

During depositing the TiAlSiCN layer 11, atomic silicon can be not diffused in the TiN crystal, and is from $Si_3N_4$ phrase at the boundary of the TiN crystal, which can prevent the TiN crystal from enlarging, to maintain the TiN crystal at nanometer level. The nanometer lever TiN crystal can improve hardness and toughness of the TiAlSiCN layer 11. Additionally, atomic carbon not only can react with atomic titanium, atomic aluminum and atomic nitrogen to form solid solution phrase, and can form TiC phrase, which can further improve hardness and toughness of the TiAlSiCN layer 11.

Additionally, the atomic carbon content and/or the atomic nitrogen content in the TiAlSiCN layer 11 gradually increases from near the bonding layer 20 to away from the bonding layer 20. The coefficient of thermal expansion of the TiAl-SiCN layer 11 is close to the coefficient of thermal expansion of the bonding layer 20, so the stress generated between the TiAlSiCN layer 11 and the bonding layer 20 is small. Thus, the TiAlSiCN layer 11 can improve the binding force between the bonding layer 20 and the TiAlSiCN layer 11 so the coating 10 can be firmly deposited on the substrate 30. As said above, the TiAlSiCN layer 11 can improve the hardness of the coating 10 and the binding force between the bonding layer 20 and the TiAlSiCN layer 11, which can improve the abrasion resistance of the coating 10.

When the coating 10 is located in high temperature and oxygen environment, the atomic aluminum and atomic silicon in the TiAlSiCN layer 11 can be react with oxygen to form $SiO_2$ which can prevent exterior oxygen from diffusing in the TiAlSiCN layer 11. Thus, the TiAlSiCN layer 11 can make the coating 10 has high temperature oxidation resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a metal substrate;
   a bonding layer formed on and in contact with the substrate, the bonding layer being a titanium aluminum silicon layer; and
   a coating formed on and in contact with the bonding layer, the coating comprising:
   a titanium aluminum silicon carbon-nitride layer including a first surface covering on the bonding layer and an opposite second surface, at least one of the atomic carbon content and the atomic nitrogen content in the titanium aluminum silicon carbon-nitride layer gradually increases from the first surface to the second surface.

2. The article as claimed in claim 1, wherein the titanium aluminum silicon carbon-nitride layer is deposited by magnetron sputtering, using a titanium aluminum silicon alloy target containing atomic silicon in a range from about 1 to about 10 wt %; and the wt % content of the atomic titanium in the titanium aluminum silicon alloy target is equal to the wt % content of the atomic aluminum in the titanium aluminum silicon alloy target.

3. The article as claimed in claim 1, wherein the titanium aluminum silicon carbon-nitride layer has a thickness ranging from about 0.7 micrometers to about 2.5 micrometers.

4. The article as claimed in claim 1, further comprising a color layer covering on the second surface of the titanium aluminum silicon carbon-nitride layer, to decorate the appearance of the coating.

5. The article as claimed in claim 1, wherein the bonding layer has a thickness ranging from about 200 nanometers to about 300 micrometers.

6. The coating as claimed in claim 5, wherein the bonding layer is deposited by magnetron sputtering, using a titanium aluminum silicon alloy target containing atomic silicon in a range from about 1 to about 10 wt %; and the wt % content of the atomic titanium in the titanium aluminum silicon alloy target is equal to the wt % content of the atomic aluminum in the titanium aluminum silicon alloy target.

\* \* \* \* \*